US012770838B2

(12) United States Patent
Patel H B et al.

(10) Patent No.: US 12,770,838 B2
(45) Date of Patent: Oct. 20, 2026

(54) LINER AND EDGE RING TO PREVENT GAS DIFFUSION

(71) Applicant: Applied Materials, Inc., Santa Clara, CA (US)

(72) Inventors: Shashidhara Patel H B, Bangalore (IN); Amit Sahu, Bangalore (IN); Muhannad Mustafa, Milpitas, CA (US); Sanjeev Baluja, Campbell, CA (US); Yixiong Yang, Fremont, CA (US); Srinivas Gandikota, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 482 days.

(21) Appl. No.: 18/429,618

(22) Filed: Feb. 1, 2024

(65) Prior Publication Data

US 2025/0253139 A1 Aug. 7, 2025

(51) Int. Cl.
*C23C 16/455* (2006.01)
*H01J 37/32* (2006.01)
*H10P 72/76* (2026.01)

(52) U.S. Cl.
CPC .. *H01J 37/32642* (2013.01); *C23C 16/45544* (2013.01); *H10P 72/7606* (2026.01); *H01J 2237/332* (2013.01)

(58) Field of Classification Search
CPC ........... H01J 37/32642; H01J 2237/332; H01J 37/3244; H01J 37/32449; C23C 16/45544; C23C 16/4409; C23C 16/45565; C23C 16/45561; H10P 72/7606
USPC ........................ 118/715; 156/345.33, 345.34
See application file for complete search history.

(56) References Cited

U.S. PATENT DOCUMENTS 5,443,648 A * 8/1995 Ohkase .................. C23C 16/54 118/724
5,884,009 A * 3/1999 Okase ................ H10P 72/0402 392/416
5,891,350 A * 4/1999 Shan ................ H01J 37/32834 118/723 E
6,350,320 B1 2/2002 Sherstinsky et al.
9,873,941 B2 * 1/2018 Ito .................... C23C 16/45519
(Continued)

FOREIGN PATENT DOCUMENTS

JP 2005033062 A 2/2005
KR 20210032124 A 3/2021
KR 20220167830 A 12/2022

OTHER PUBLICATIONS

PCT International Search Report and Written Opinion in PCT/US2024/060316 dated Mar. 31, 2025, 10 pages.

*Primary Examiner* — Rudy Zervigon
(74) *Attorney, Agent, or Firm* — Servilla Whitney LLC

(57) ABSTRACT

Process kits for semiconductor manufacturing processing chambers and semiconductor manufacturing processing chambers using the process kits are described. The process kits include an edge ring with a lower annular ring portion having a plurality of annularly spaced edge ring fins extending upwardly from the top surface of the lower annular ring portion. A liner has an inwardly directed annular extension with annularly spaced liner fins extending downwardly from the bottom surface of the inwardly directed annular extension. The edge ring fins and liner fins interdigitate without contacting to form a tortuous flow path.

20 Claims, 8 Drawing Sheets

(56) References Cited

U.S. PATENT DOCUMENTS

| | | | |
|---|---|---|---|
| 11,643,725 | B2 | 5/2023 | Pathak et al. |
| 2008/0141942 | A1 | 6/2008 | Brown et al. |
| 2013/0058636 | A1 | 3/2013 | Koelmel et al. |
| 2014/0270731 | A1 | 9/2014 | Gerling et al. |
| 2019/0362949 | A1 | 11/2019 | Sarode et al. |
| 2020/0161165 | A1 | 5/2020 | Raj et al. |
| 2020/0176230 | A1 | 6/2020 | Lu et al. |
| 2020/0373190 | A1 | 11/2020 | Lee et al. |
| 2021/0332931 | A1 | 10/2021 | Hoshi et al. |
| 2022/0037129 | A1 | 2/2022 | Koshimizu |
| 2022/0285136 | A1 | 9/2022 | Han et al. |
| 2022/0310367 | A1 | 9/2022 | Saito |
| 2022/0415636 | A1 | 12/2022 | Ramalingam et al. |
| 2023/0238269 | A1 | 7/2023 | Aderhold et al. |
| 2024/0117490 | A1* | 4/2024 | Tavakoli ................. C23C 14/46 |
| 2025/0037971 | A1* | 1/2025 | Ni ..................... H01J 37/32082 |

* cited by examiner

300

LINER AND EDGE RING TO PREVENT GAS DIFFUSION

TECHNICAL FIELD

Embodiments of the disclosure are directed to showerheads for semiconductor manufacturing processing chambers. In particular, embodiments of the disclosure are directed to showerhead designs for the plasma-enhanced deposition of molybdenum films.

BACKGROUND

Reliably producing submicron and smaller features is one of the key requirements of very large scale integration (VLSI) and ultra large scale integration (ULSI) of semiconductor devices. However, with the continued miniaturization of circuit technology, the dimensions of the size and pitch of circuit features, such as interconnects, have placed additional demands on processing capabilities. The various semiconductor components (e.g., interconnects, vias, capacitors, transistors) require precise placement of high aspect ratio features. Reliable formation of these components is critical to further increases in device and density.

Additionally, the electronic device industry and the semiconductor industry continue to strive for larger production yields while increasing the uniformity of layers deposited on substrates having increasingly larger surface areas. These same factors in combination with new materials also provide higher integration of circuits per unit area on the substrate.

Existing semiconductor substrate processing chambers don't have any sealing between the top and the bottom portions of the chamber due to a moving pedestal. Typical sealing solutions are not applicable due to high temperatures at the region and also flexibility to adjust process spacing. Additionally, because of the high-pressure process environment, the precursor permeates below the pedestal and deposits on the heater and surroundings, significantly impacting heater performance and on wafer results.

Accordingly, there is a need in the art for processing chambers with improved sealing.

SUMMARY

One or more embodiments of the disclosure are directed to process kits for a semiconductor manufacturing processing chamber. The process kits comprise an edge ring and a liner. The edge ring comprises a lower annular ring portion with a plurality of annularly spaced edge ring fins extending upwardly from a top surface of the lower annular ring portion. The liner has an inwardly directed annular extension with a plurality of annularly spaced fins extending downwardly from a bottom surface of the inwardly directed annular extension. The plurality of annularly spaced liner fins are positioned to interdigitate with the plurality of annularly spaced edge ring fins without contacting so that the annularly spaced edge ring fins and the plurality of annularly spaced liner fins alternate to create a tortuous flow path.

Additional embodiments of the disclosure are directed to semiconductor manufacturing processing chambers comprising a process kit comprising an edge ring and a liner. The edge ring comprises a lower annular ring portion with a plurality of annularly spaced edge ring fins extending upwardly from a top surface of the lower annular ring portion. The liner has an inwardly directed annular extension with a plurality of annularly spaced fins extending downwardly from a bottom surface of the inwardly directed annular extension. The plurality of annularly spaced liner fins are positioned to interdigitate with the plurality of annularly spaced edge ring fins without contacting so that the annularly spaced edge ring fins and the plurality of annularly spaced liner fins alternate to create a tortuous flow path.

Further embodiments of the disclosure are directed to process kits for semiconductor manufacturing processing chambers. The process kits comprise an edge ring and a liner. The edge ring comprises an upper annular ring portion connected to an inner connecting ring portion that extends outwardly from an outer surface of the inner connecting ring. The lower annular ring portion has at least three annularly spaced edge ring fins extending upwardly from a top surface of the lower annular ring portion. The innermost annularly spaced edge ring fin is spaced a distance from the outer surface of the inner connecting ring. The liner has an inwardly directed annular extension with at least two annularly spaced fins extending downwardly from a bottom surface of the inwardly directed annular extension. The annularly spaced liner fins are positioned to interdigitate with the plurality of annularly spaced edge ring fins without contacting so that the annularly spaced edge ring fins alternate with the plurality of annularly spaced liner fins to create a tortuous flow path. The innermost annularly spaced liner fin is spaced a distance from an inner edge of the inwardly directed annular extension to form an inwardly directed cantilever. The inwardly directed cantilever extends over a top surface of the innermost annularly spaced edge ring fin.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
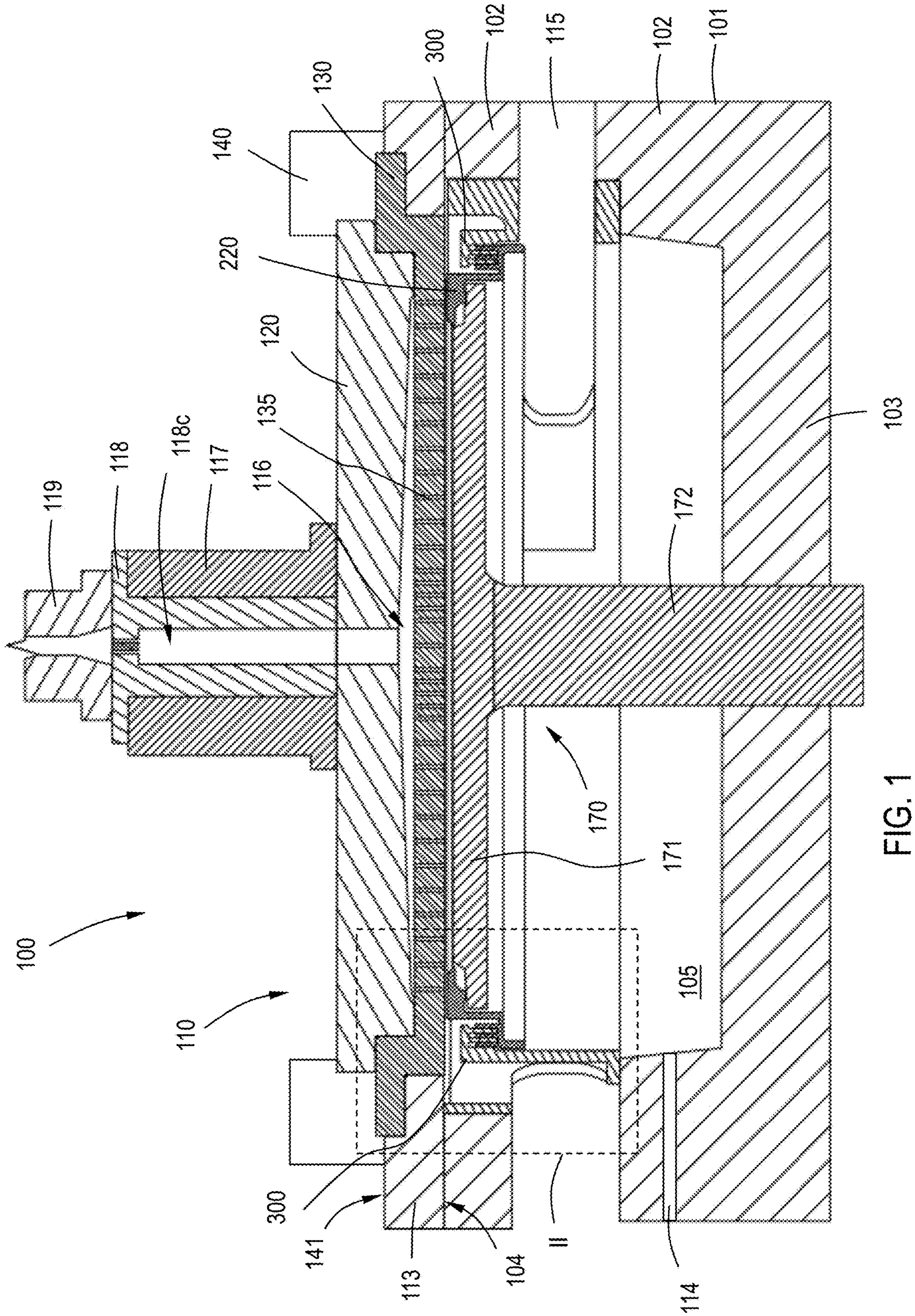
FIG. 1 illustrates a semiconductor manufacturing processing chamber according to one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term “substrate” refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A “substrate” as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term “substrate surface” is intended to include such underlayer as the context indicates. Thus, for example, where a film/layer or partial film/layer has been deposited onto a substrate surface, the exposed surface of the newly deposited film/layer becomes the substrate surface.

“Atomic layer deposition” or “cyclical deposition” as used herein refers to a process comprising the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. A spatial ALD process can alternatively comprise exposing the substrate surface to the two or more reactive compounds at separate stations, for example, so that the substrate is substantially not exposed to more than one reactive compound simultaneously. As used in this specification and the appended claims, the term “substantially” used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas. The gas curtain can be any suitable gas separation arrangement known to the skilled artisan. For example, in some embodiments of a spatial ALD process chamber, a gas curtain is formed by a combination of purge gas ports and vacuum ports to maintain separation between the reactive gases to prevent gas-phase reactions. In some embodiments of a spatial ALD process chamber, separate process stations are configured to form a mini-process environment within each station.

As used in this specification and the appended claims, the terms “reactive compound”, “reactive gas”, “reactive species”, “precursor”, “process gas” and the like are used interchangeably to mean a substance with a species capable of reacting with the substrate surface or material on the substrate surface in a surface reaction (e.g., chemisorption, oxidation, reduction, cycloaddition). The substrate, or portion of the substrate, is exposed sequentially to the two or more reactive compounds which are introduced into a reaction zone of a processing chamber.

The use of directional terms, for example, “up”, “down”, “above”, “below”, “upwardly”, “downwardly” should not be taken as limiting the disclosure or claims to any specific orientation with respect to gravity. These terms are used for descriptive purposes and refer to the orientation illustrated in the drawings only. The skilled artisan will recognize that the directional alignment of the components can be arranged to suit various shaped and sized components.

One or more embodiments of the disclosure advantageously provide tortuous liner and edge ring designs which help reduce ~90% process gas diffusion to the bottom of the pedestal versus existing bottom purge designs. In some embodiments, sealing without part-to-part contact allow for adjustment of the process spacing. In some embodiments, the tortuous liner and edge ring design can be used at high (>250° C.) and low (<150° C.) temperature applications. The tortuous liner and edge ring design are advantageously able to withstand variable high (50 T) and low (5 T) pressure ranges. The tortuous liner and edge ring design are cost effective, as they are made of metal, and, hence, can be cleaned and are reusable. Some embodiments advantageously provide mechanical seals that a tortuous path to help prevent leakage from the process region above the pedestal to chamber interior below the pedestal. Some embodiments are easily retrofittable to existing hardware without much change or reconfiguration.

Some embodiments of the edge ring and liner are made of metal and can be cleaned and reused. In one or more embodiments, the liner and edge ring are not affected by process chemistry or by-products and have increased lifetimes. Some embodiments can be advantageously adapted to any atomic layer deposition (ALD), chemical vapor deposition (CVD), molecular layer deposition (MLD) chambers, or plasma-enhanced versions thereof. Some embodiments advantageously reduce the costs of preventative maintenance on the process chambers because of the improved lifetimes and/or the improved component parameters.

Figure 2:
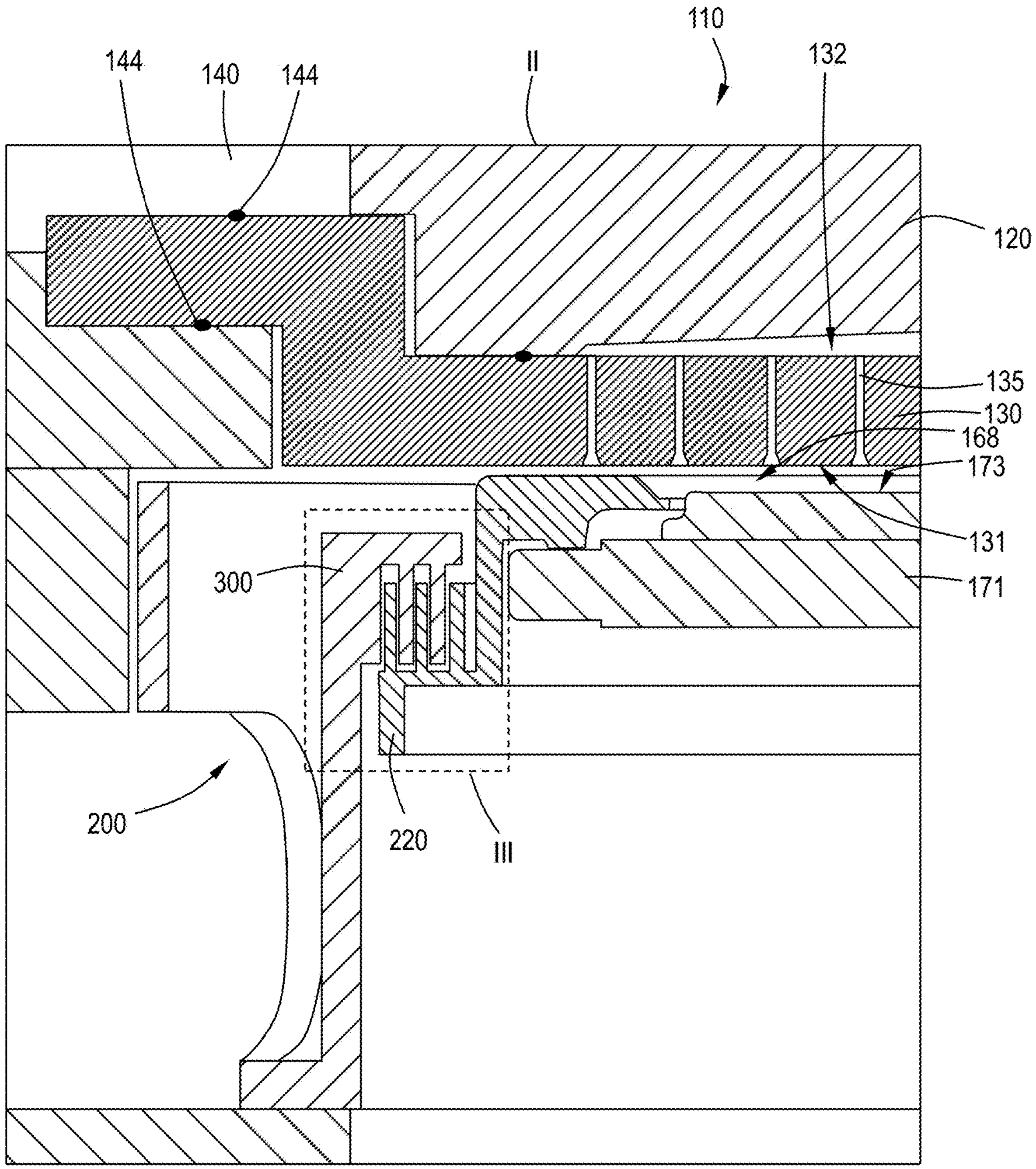
FIG. 2 shows an expanded view of region II of FIG. 1.
Figure 3:
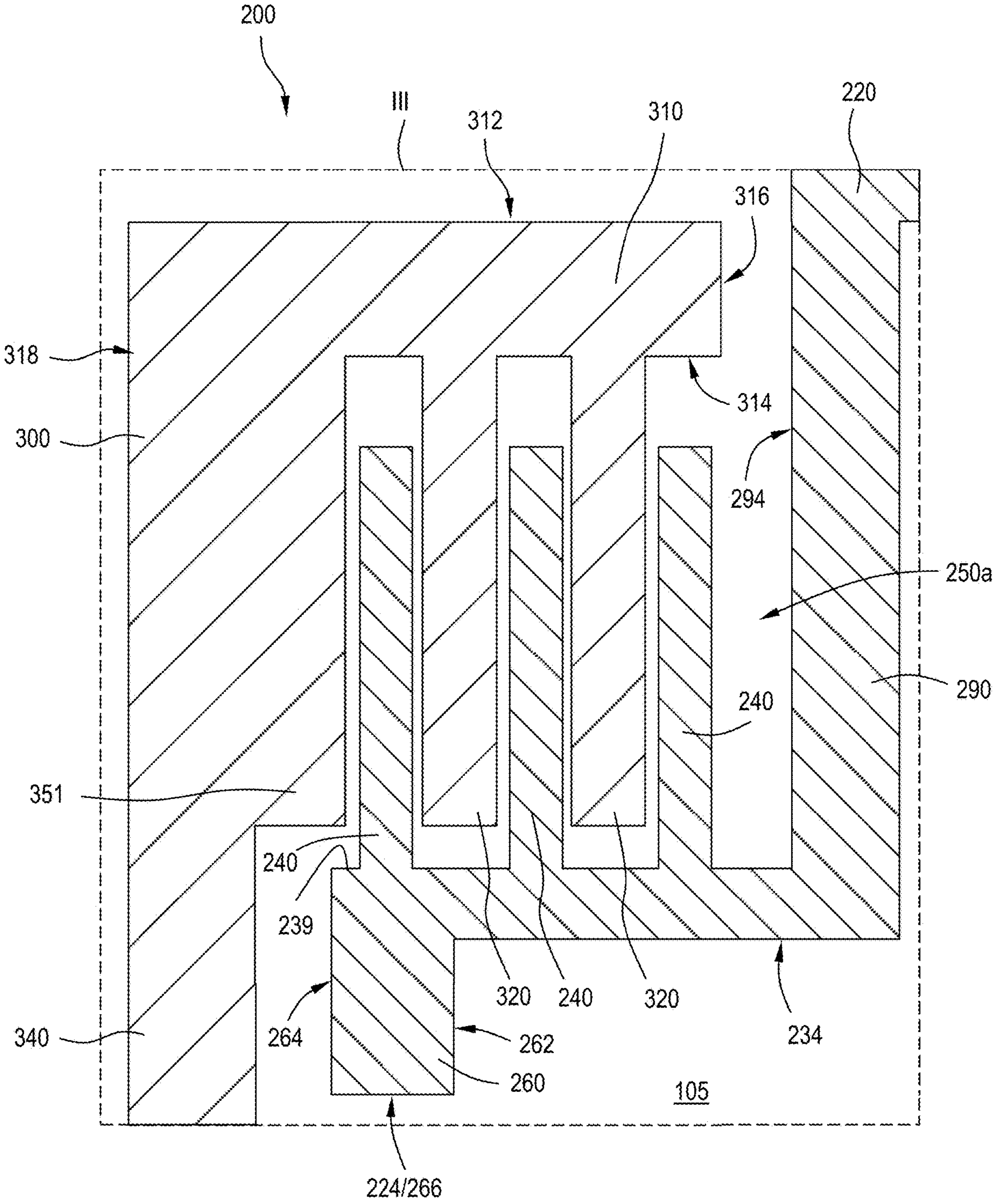
FIG. 3 shows an expanded view of region III of FIG. 2.

FIG. 1 illustrates a semiconductor manufacturing processing chambers 100 according to one or more embodiment of the disclosure. FIG. 2 shows an expanded view of region II of FIG. 1. FIG. 3 shows an expanded view of region III of FIG. 2.

Referring to FIGS. 1 through 3, the semiconductor manufacturing processing chambers 100 comprises a chamber body 101 with a sidewall 102 and bottom wall 103. The chamber body 101, in conjunction with the showerhead assembly 110 encloses an interior 105 of the semiconductor manufacturing processing chambers 100. The sidewall 102 and bottom wall 103 can be integrally formed or separate component connected together by any suitable connection or fastener known to the skilled artisan.

The showerhead assembly 110 comprises a backing plate 120 and a faceplate 130. In some embodiments, the showerhead assembly 110 further comprises a pumping ring 140. The showerhead assembly 110 illustrated in FIG. 1 includes the backing plate 120, faceplate 130 and pumping ring 140. However, the skilled artisan will recognize that the pumping ring 140 can be separate from the showerhead assembly 110 or, in some embodiments, can be omitted from the semiconductor manufacturing processing chamber 100.

In use, one or more process gases (including reactive gases and inert gases) flow into the showerhead plenum 116 of the showerhead assembly 110. For example, one or more gases can flow through gas manifold 117 into opening 118*a* of gas inlet 118. The gas flows can be directed in any suitable manner, for example, to create a vortex flow that improves gas mixing and distribution within the showerhead plenum 116. In some embodiments, one or more process gases flow through a cooling flange 119, for example, from a remote plasma source (not shown) positioned on top of the cooling flange 119. The process gases flowing through the cooling flange 119 enter the opening 118*a* of the gas inlet 118 and flow downward toward the showerhead plenum 116 through the backing plate 120.

In some embodiments, an inert gas purge line (not shown) is connected to an inner channel of the gas inlet 118 to provide a continuous inert gas purge to prevent back streaming of gases to the remote plasma source. In some embodiments, inclusion of the inert gas purge eliminates the need for an isolation valve through continuous inert gas purge.

In some embodiments, the showerhead assembly 110 is positioned to that the bottom surface 141 of the pumping ring 140 is in contact with a top surface 104 of the chamber sidewall 102, forming an interior 105 of the processing chamber 100. In some embodiments, the top surface 104 of the chamber sidewall 102 has a choke plate 113 positioned thereon with the pumping ring 140 in contact with the choke plate 113. The skilled artisan will recognize that the pumping ring 140 can be in contact with the top surface 104 of the chamber sidewall 102 through the choke plate 113, or the pumping ring 140 can be in direct contact with the top surface 104 of the chamber sidewall 102. As used in this manner, "direct contact" means that the stated parts touch without an intervening component. In some embodiments, the pumping ring 140 is in direct contact with the choke plate 113 and the choke plate 113 is in direct contact with the top surface 104 of the chamber sidewall 102.

The showerhead assembly 110 includes a faceplate 130, which may also be referred to as a "showerhead". The faceplate 130 has a front surface 131 and a back surface 132 defining a thickness $T_F$ of the faceplate 130 with a plurality of apertures 135 extending through the thickness thereof. In some embodiments, the thickness $T_F$ of the faceplate 130 is in the range of 0.25 inches to 2.5 inches, or in the range of 0.5 inches to 2 inches, or in the range of 0.75 inches to 1.5 inches, or about 1 inch.

During use, the backing plate 120, faceplate 130 and pumping ring 140, in addition to other components, may be separated by one or more O-rings 144 to help maintain a fluid-tight seal for the processing chamber. For example, as shown in FIG. 2, the showerhead assembly 110 includes a plurality of O-rings positioned between the backing plate 120 and the faceplate 130 and/or a plurality of O-rings 144 positioned between the faceplate 130 and the pumping ring 140.

During processing, the interior 105 of the semiconductor manufacturing processing chambers 100 is typically maintained at a controlled pressure (usually a low pressure environment) using one or more gas inlet 114 and one or more exhaust 115. While a single gas inlet 114 and gas outlet 115 are illustrated, the skilled artisan will be familiar with the general construction of a chamber body 101 and the use and locations of one or more gas inlets and one or more exhaust systems and connections.

A substrate support 170 is located within the interior 105 of the semiconductor manufacturing processing chamber 100. The substrate support 170 of some embodiments comprises a support body 171 positioned on a support shaft 172. The support body 171 has a support surface 173 (as shown in FIG. 2) configured to support a semiconductor wafer (not shown) for processing. The support shaft 172 of some embodiments is configured to move the support body 171 closer to/further from the faceplate 130 and/or around a rotational axis of the support shaft 172. During processing, the support surface 173 is spaced from the front surface 131 of the faceplate 130 to form a process gap 168.

In the embodiment shown in expanded view of FIG. 2, the support body 171 is made up of more than one component connected together. For example, two components of the support body 171 can be brazed or welded to each other to allow for the machining of internal channels, electrodes or wiring.

In some embodiments, the support body 171 includes a thermal element (not shown) configured to heat the semiconductor wafer on the support surface 173. The thermal element can be any suitable heating mechanism known to the skilled artisan. For example, in some embodiments, the thermal element comprises a resistive heating element that is connected to a power supply (not shown) configured to apply power to the thermal element to heat the support body 171. In some embodiments, the support body 171 includes an electrostatic chuck (ESC) (not shown). The skilled artisan will be familiar with the construction of the ESC and the manner in which the ESC is powered and employed.

One or more embodiments of the disclosure are directed to a process kit 200 for a semiconductor manufacturing processing chamber 100. The process kit 200 comprising an edge ring 220 and a liner 300 that are configured to interdigitate (or cooperatively interact) to minimize or prevent gas diffusion from the process gap 168 to the interior 105 of the chamber body 101 below the substrate support 170.

Figure 4:
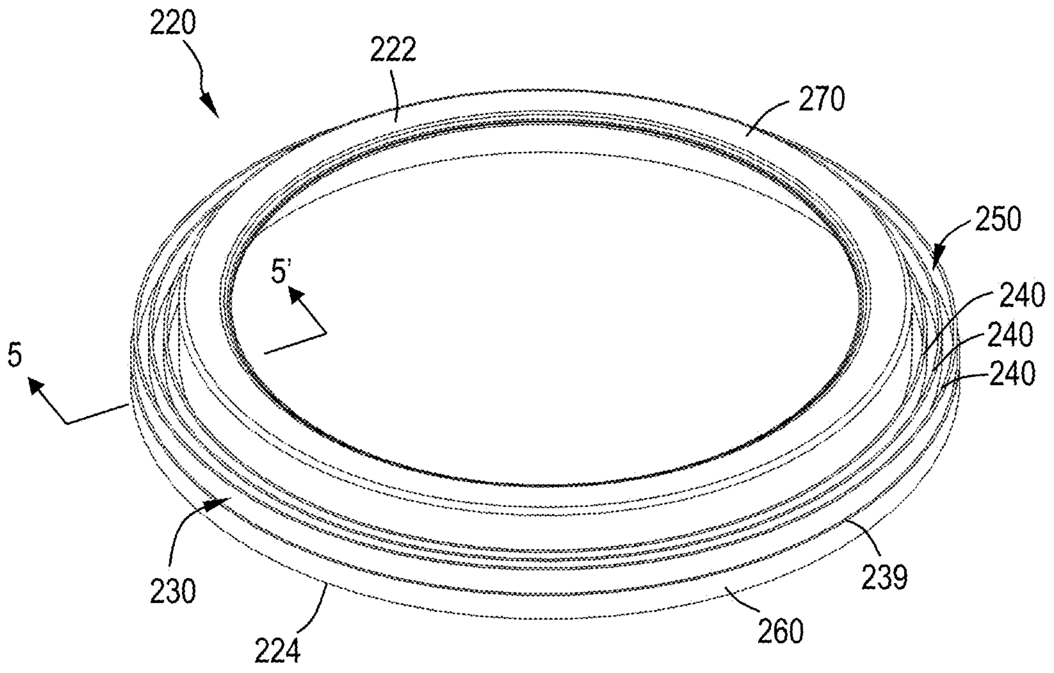
FIG. 4 shows an orthographic view of an edge ring according to one or more embodiments of the disclosure.
Figure 5:
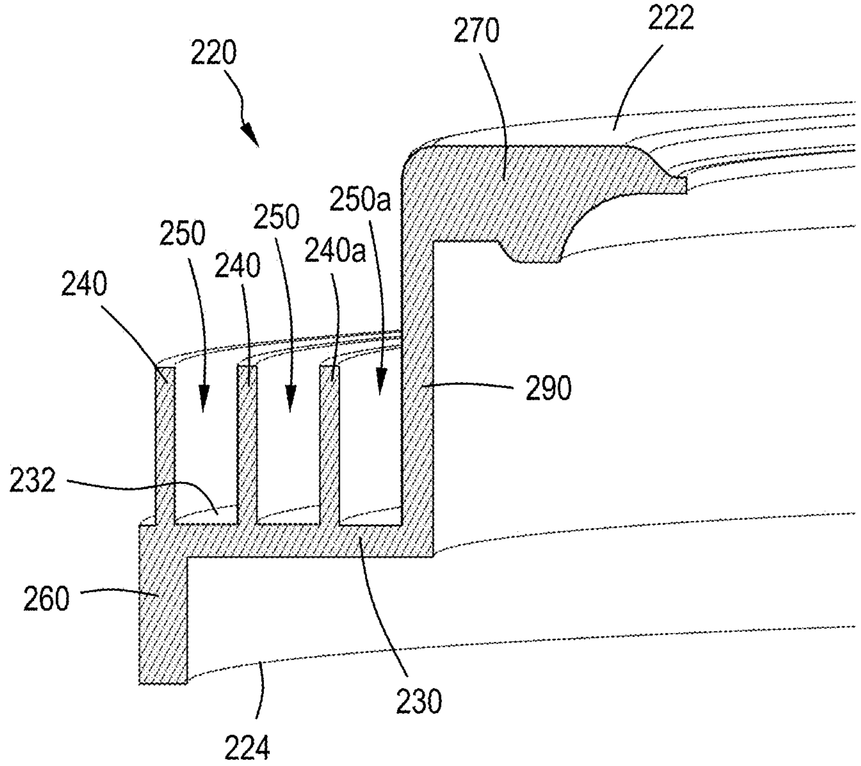
FIG. 5 shows a cross-sectional view of the edge ring of FIG. 4 taken along line 5-5'.
Figure 6:
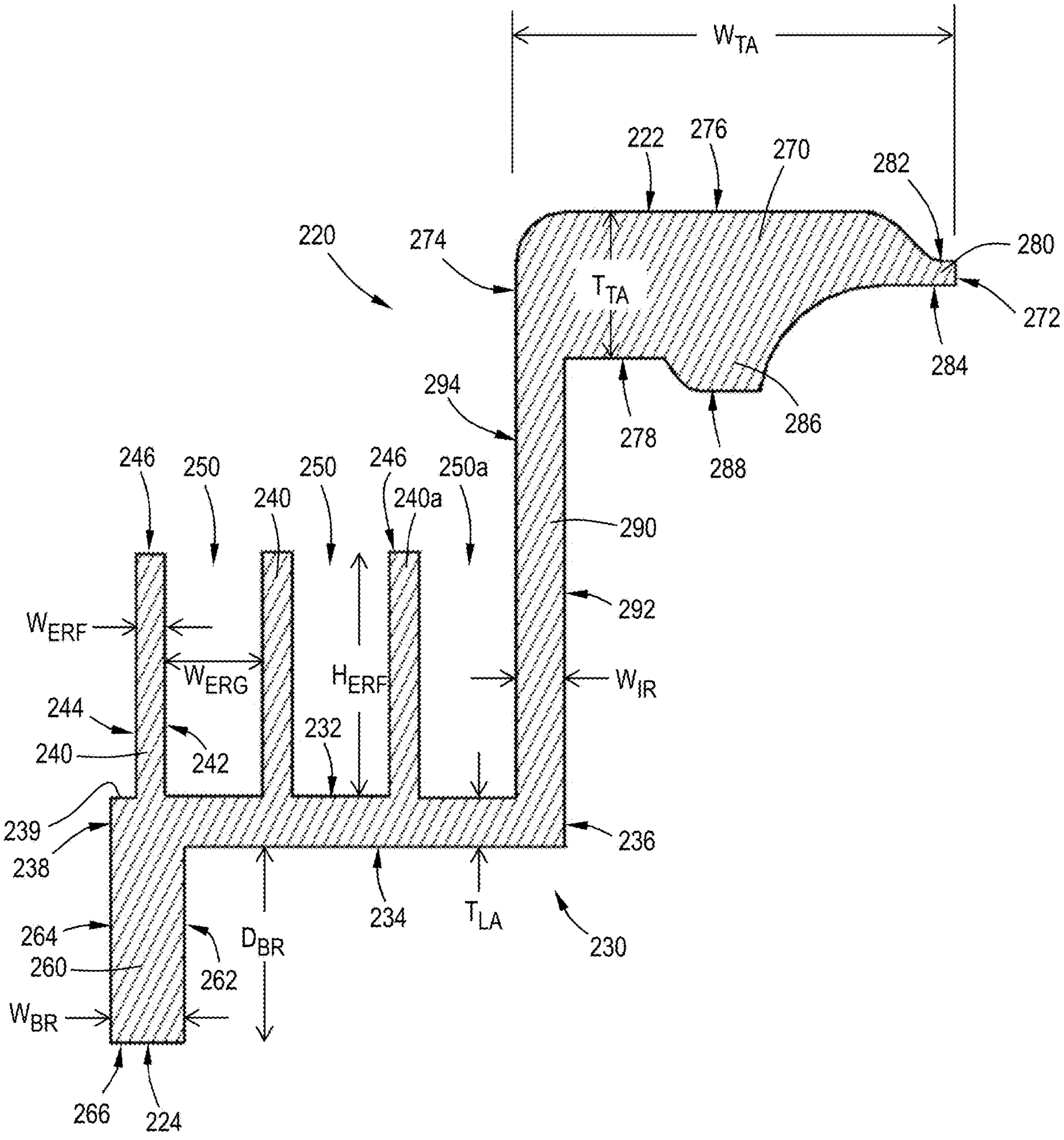
FIG. 6 shows a cross-sectional slice of the edge ring of FIG. 4 taken along line 5-5'.

FIG. 4 shows an orthographic view of an edge ring 220 according to one or more embodiments of the disclosure. FIG. 5 shows a cross-sectional view of the edge ring 220 of FIG. 4 taken along line 5-5'. FIG. 6 shows a cross-sectional slice of the edge ring 220 of FIG. 4 taken along line 5-5'. With reference to FIGS. 3 through 6, the edge ring 220 has a top surface 222 and a bottom surface 224 defining a total thickness of the edge ring 220.

In some embodiments, the edge ring 220 comprises a lower annular ring portion 230 with a top surface 232 and a bottom surface 234 defining a thickness $T_{LA}$ of the lower annular ring portion 230. The lower annular ring portion 230 has an inner diameter 236 and an outer diameter 238 defining a width of the lower annular ring portion 230. The thickness $T_{LA}$ of some embodiments is in the range of 0.5 mm to 10 mm, or in the range of 1 mm to 5 mm, or in the range of 2 mm to 4 mm. The width of some embodiments is in the range of 5 mm to 50 mm, or in the range of 10 mm to 40 mm, or in the range of 15 mm to 35 mm, or in the range of 20 mm to 30 mm.

The lower annular ring portion 230 has a plurality of annularly spaced edge ring fins 240 extending upwardly from a top surface 232 of the lower annular ring portion 230 creating a plurality of gaps 250 between adjacent annularly spaced edge ring fins 240. Each of the plurality of annularly spaced edge ring fins 240 independently has a top surface 246 spaced a distance from the top surface 232 of the lower annular ring portion 230 to define a height $H_{ERF}$ of the annularly spaced edge ring fins 240. In some embodiments, the height $H_{ERF}$ of each of the annularly spaced edge ring fins 240 are substantially the same. As used in this manner, the term "substantially the same" means that the heights $H_{ERF}$ of the individual edge ring fins 240 are within 0.1 mm of the other edge ring fins. In some embodiments, The height $H_{ERF}$ of at least one of the edge ring fins 240 is different than at least one other edge ring fin 240. In some embodiments, the height $H_{ERF}$ of the plurality of annularly spaced edge ring fins 240 are independently in the range of 2 mm to 25 mm, or in the range of 5 mm to 20 mm.

Each of the plurality of annularly spaced edge ring fins 240 independently has an inner diameter with an inner diameter face 242 and an outer diameter with an outer diameter face 244 that define a width $W_{ERF}$ of the annularly spaced edge ring fins 240. In some embodiments, the width $W_{ERF}$ of the plurality of annularly spaced edge ring fins 240 are independently in the range of 1 mm to 10 mm, or in the range of 1.5 mm to 5 mm, or in the range of 2 mm to 4 mm. In some embodiments, each of the plurality of annularly spaced edge ring fins 240 have substantially the same width $W_{ERF}$. As used in this manner, the term "substantially the same" means that the widths $W_{ERF}$ of the individual edge rings fins 240 are within 0.1 mm of the other edge ring fins. In some embodiments, The width $W_{ERF}$ of at least one of the edge ring fins 240 is different than at least one other edge ring fin 240.

The number of annularly spaced edge ring fins 240 can be varied to change the gas flow dynamics of the process kit 200. In the illustrated embodiments, there are three annularly spaced edge ring fins 240. In some embodiments, there are two annularly spaced edge ring fins 240. In some embodiments, there are four or five annularly spaced edge ring fins 240. In some embodiments, there are three or more annularly spaced edge ring fins 240.

The plurality of annularly spaced edge ring fins 240 create a plurality of gaps 250 between adjacent edge ring fins 240. The width $W_{ERG}$ of the plurality of gaps 250 are measured from the outer diameter face 244 of a first edge ring fin 240 to the inner diameter face 242 of an adjacent second edge ring fin 240 where the outer diameter of the first edge ring fin 240 is smaller than the inner diameter of than the second edge ring fin 240. In some embodiments, the gaps 250 between adjacent annularly spaced edge ring fins 240 are substantially the same. As used in this manner, the term "substantially the same" means the that gaps vary by no more than 0.1 mm. In some embodiments, at least one gap 250 has a different width $W_{ERG}$ than at least one other gap 250.

In some embodiments, the edge ring 220 further comprises a bottom ring portion 260 connected to an outer edge (outer diameter 238) of the lower annular ring portion 230. The bottom ring portion 260 has an inner diameter with an inner diameter face 262 and an outer diameter with an outer diameter face 264 defining a width $W_{BR}$ of the bottom ring portion 260. The outer diameter face 264 extends from the outer edge of the top surface 232 of the lower annular ring portion 230 to a bottom face 266 of the bottom ring portion 260 defining a length of the outer diameter face 264. The depth $D_{BR}$ of the bottom ring portion 260 is measured from the bottom surface 234 of the lower annular ring portion 230 to the bottom face 266 of the bottom ring portion 260. In the illustrated embodiment, the outer diameter face 264 of the bottom ring portion 260 is coincident with the outer diameter 238 of the lower annular ring portion 230.

In some embodiments, the width $W_{BR}$ of the bottom ring portion 260 is in the range of 1 mm to 10 mm, or in the range of 1.5 mm to 5 mm or in the range of 2 mm to 4 mm. In some embodiments, the depth $D_{BR}$ of the bottom ring portion 260 is in the range of 5 mm to 50 mm, or in the range of 10 mm to 25 mm.

In some embodiments, as shown in the Figures, the outer diameter face 244 of the outermost annularly spaced edge ring fin 240 is offset from an outer diameter face 264 of a bottom ring portion 260 connected to the outer diameter 238 of the lower annular ring portion 230. The offset between the outer diameter face 264 and the outer diameter face 244 creates an outer ledge 239 of the lower annular ring portion 230.

In some embodiments, as shown in the Figure, the edge ring 220 further comprises a top annular ring portion 270. The top annular ring portion 270 has an inner diameter 272 and an outer diameter 274 defining a width $W_{TA}$ of the top annular ring portion 270. The top annular ring portion 270 has a top surface 276 and a bottom surface 278 defining a thickness $T_{TA}$ of the top annular ring portion 270. The width $W_{TA}$ of the top annular ring portion 270 of some embodiments is in the range of 10 mm to 100 mm, or in the range of 15 mm to 50 mm, or in the range of 20 mm to 30 mm. The thickness $T_{TA}$ of the top annular ring portion 270 of some embodiments is in the range of 1 mm to 50 mm, or in the range of 2.5 mm to 40 mm, or in the range of 5 mm to 30 mm, or in the range of 7.5 mm to 20 mm, or in the range of 10 mm to 15 mm.

In some embodiments, the top annular ring portion 270 has an inwardly projecting extension 280 which is part of the inner region of the top annular ring portion 270. The inwardly projecting extension 280 of some embodiments is configured to support a semiconductor wafer during processing within the processing chamber 100. The inwardly projecting extension 280 has an extension top surface 282 below the top surface 276 of the top annular ring portion 270 and/or an extension bottom surface 284 above the bottom surface 278 of the top annular ring portion 270. As stated previously, the terms "above" and "below" should not be taken as implying a particular orientation with respect to gravity. Rather, the terms are used to describe a relative location with respect to the orientation illustrated in the drawings. In some embodiments, the extension top surface 282 of the inwardly projecting extension 280 is below the top surface 276 of the top annular ring portion 270 and the extension bottom surface 284 of the inwardly projecting extension 280 is above the bottom surface 278 of the top annular ring portion 270.

In some embodiments, the extension top surface 282 of the inwardly projecting extension 280 is spaced a distance below the top surface 276 of the top annular ring portion 270 that is at least half the thickness of a wafer to be processed in the semiconductor manufacturing processing chambers 100 using the edge ring 220 of the process kit 200. In some embodiments, the distance between the extension top surface 282 and the top surface 276 is less than or equal to the thickness of a wafer to be processed using the edge ring 220 of the process kit 200.

In some embodiments, the top annular ring portion 270 further comprises an extension foot 286 extending a distance to an extension foot bottom 288 from the bottom surface 278 of the top annular portion 270. The extension foot 286 of some embodiments is configured to support the edge ring 220 on an outer edge of the support body 171 of the substrate support 170 while maintaining a minimum contact with the substrate support 170. In some embodiments, the extension foot 286 extends at least 0.5 mm from the bottom surface 278 of the top annular ring portion 270.

In some embodiments, as shown in the Figures, the edge ring 220 further comprises an inner connecting ring 290 in contact with the top annular ring portion 270 and the bottom annular ring portion 230. The inner connecting ring 290 has an inner diameter with an inner diameter face 292 and an outer diameter with an outer diameter face 294 defining a width $W_{IR}$ of the inner connecting ring 290. In some embodiments, the inner diameter face 292 of the inner connecting ring 290 is coincident with the inner diameter 236 of the lower annular ring portion 230. In some embodiments, the outer diameter face 294 of the inner connecting ring 290 is coincident with the outer diameter 274 of the top annular ring portion 270.

In some embodiments, the innermost annularly spaced edge ring fin 240*a* is spaced a distance from the outer diameter face 294 of the inner connecting ring 290 to form an inner gap 250*a*. Stated differently, In some embodiments, the innermost gap 250*a* is substantially the same as the gaps 250 between adjacent annular spaced edge ring fins 240. In some embodiments, an innermost gap 250*a* is created between the innermost edge ring fin 240 and another portion of the edge ring 220.

Figure 7:
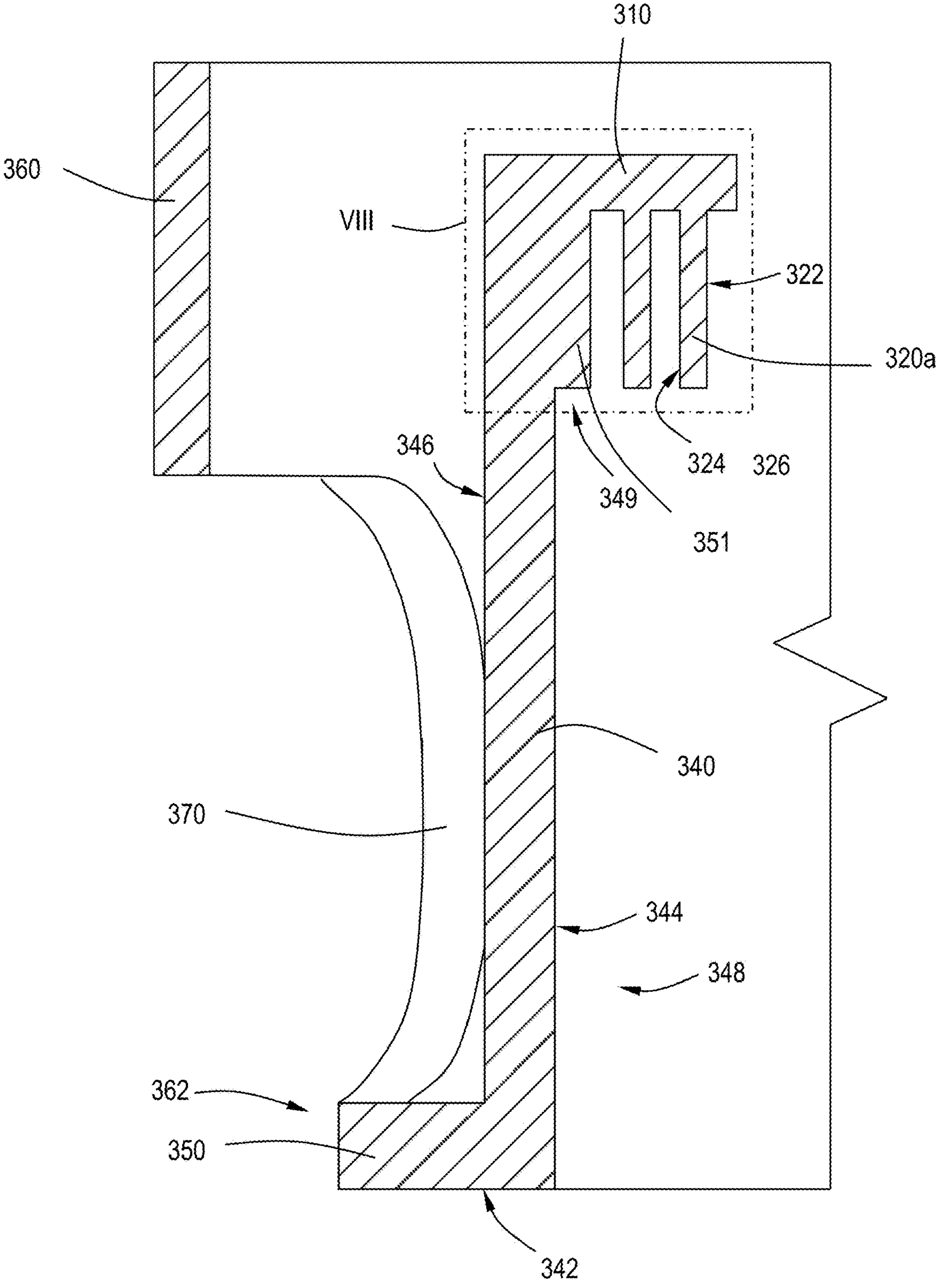
FIG. 7 shows a partial cross-sectional view of a liner according to one or more embodiments of the disclosure.
Figure 8:
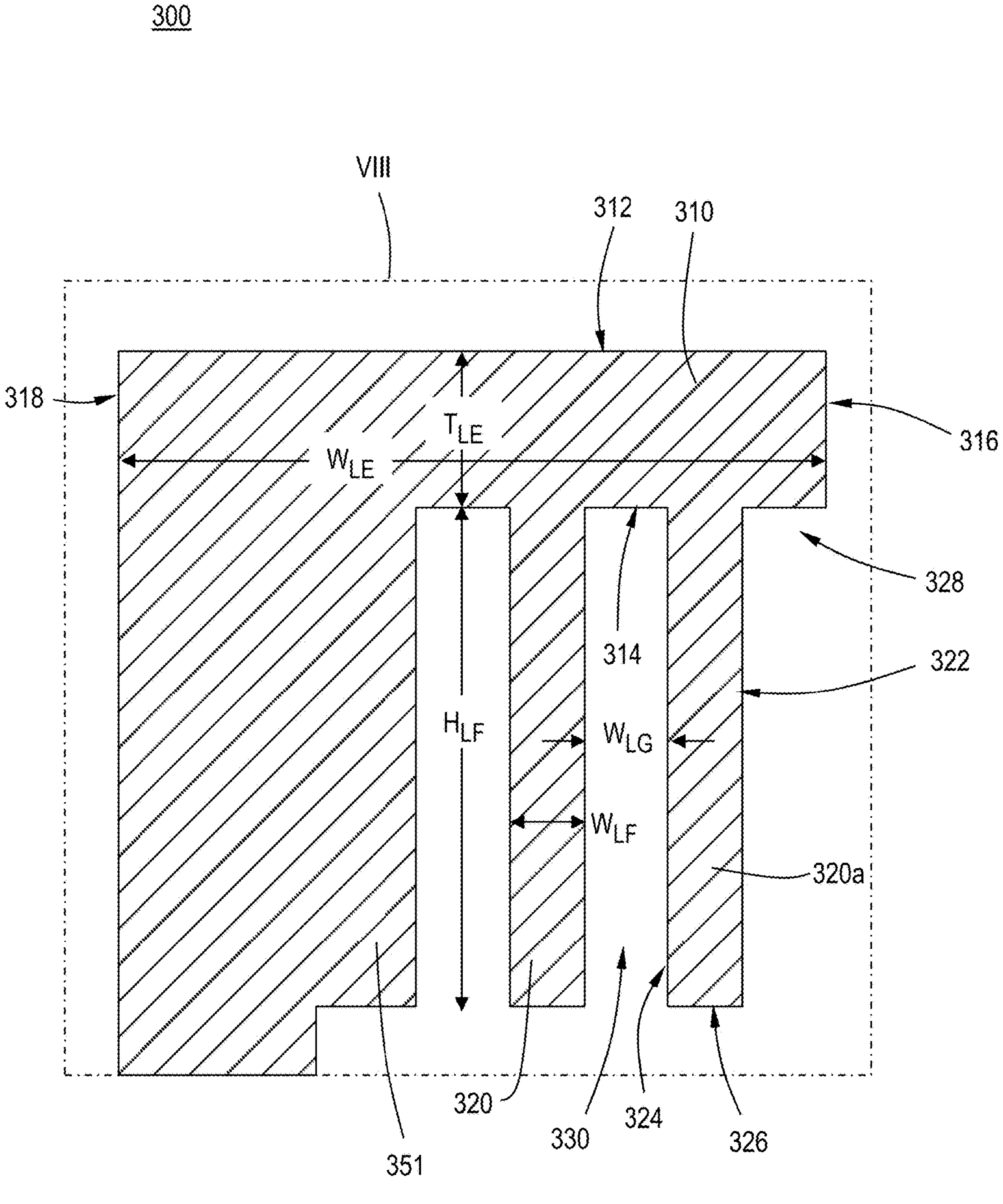
FIG. 8 shows an expanded view of region VIII of FIG. 7.

FIG. 7 shows a partial cross-sectional view of a liner 300 according to one or more embodiments of the disclosure. FIG. 8 shows an expanded view of region VIII of FIG. 7. With reference to FIGS. 2, 3, 7 and 8, the liner 300 has an inwardly directed annular extension 310 with a top surface 312 and a bottom surface 314 defining a thickness $T_{LE}$ of the inwardly directed annular extension 310. The inwardly directed annular extension 310 has an inner surface 316 and an outer surface 318 defining a width $W_{LE}$ of the inwardly directed annular extension 310.

A plurality of annularly spaced liner fins 320 extend from a bottom surface 314 of the inwardly directed annular extension 310. Stated differently, in some embodiments, the annularly spaced liner fins 320 extend downwardly from the bottom surface 314 of the inwardly directed annular extension 310 to a liner fin bottom surface 326 defining a height $H_{LE}$ of the plurality of annularly spaced liner fins 320. The annularly spaced liner fins 320 are configured to interdigitate with the plurality of annularly spaced edge ring fins 240 of the edge ring 220 to create a tortuous path to minimize or prevent process gases from flowing from the process gap 168 to the interior 105 of the semiconductor manufacturing processing chambers 100 below the substrate support 170. Stated differently, in some embodiments, the annularly spaced liner fins 320 are configured to, or positioned to, cooperatively interact or mesh with the plurality of annularly spaced edge ring fins 240 without contacting so that the annularly spaced edge ring fins 240 alternate with the plurality of annularly spaced liner fins 320 to create a tortuous flow path 305.

Each of the annularly spaced liner fins 320 has an inner diameter with an inner diameter face 322 and an outer diameter with an outer diameter face 324 defining a width $W_{LF}$ of the annularly spaced liner fins 320. In some embodiments, the width $W_{LF}$ of the plurality of annularly spaced liner fins 320 are independently in the range of 1 mm to 10 mm, or in the range of 1.5 mm to 5 mm, or in the range of 2 mm to 4 mm. In some embodiments, each of the plurality of annularly spaced liner fins 320 have substantially the same width $W_{LF}$. As used in this manner, the term "substantially the same" means that the widths $W_{LF}$ of the individual liner fins 320 are within 0.1 mm of the other liner fins. In some embodiments, The width $W_{LF}$ of at least one of the liner fins 320 is different than at least one other liner fin 320.

The number of annularly spaced liner fins 320 can be varied to change the gas flow dynamics of the process kit 200. In the illustrated embodiments, there are two annularly spaced liner fins 320. In some embodiments, there are three annularly spaced liner fins 320. In some embodiments, there are four or five annularly spaced liner fins 320. In some embodiments, there is one less liner fin 320 than edge ring fins 240. For example, as shown in the illustrated embodiments, there are three edge ring fins 240 and two liner fins 320.

The plurality of annularly spaced liner fins 320 create a plurality of gaps 330 between adjacent edge ring fins 240. The width $W_{LG}$ of the plurality of gaps 330 are measured from the outer diameter face 324 of a first liner fin 320 to the inner diameter face 322 of an adjacent second liner fin 320 where the outer diameter of the first liner fin 320 is smaller than the inner diameter of the second liner fin 320. In some embodiments, the gaps 330 between adjacent annularly spaced liner fins 320 are substantially the same. As used in this manner, the term "substantially the same" means the that gaps vary by no more than 0.1 mm. In some embodiments, at least one gap 330 has a different width $W_{LG}$ than at least one other gap 330.

In some embodiments, as shown in the Figures, the innermost annularly spaced liner fin 320*a* is offset from the inner diameter face 322 of the inwardly directed annular extension 310 forming an inwardly directed cantilever 328. Stated differently, in some embodiments, the inner diameter face 322 of the innermost annularly spaced liner fin 320*a* is a distance from the inner surface 316 of the inwardly directed annular extension 310 along the width $W_{LE}$ of the inwardly directed annular extension 310. In some embodiments, the inwardly directed cantilever 328 extends over the top surface 246 of the innermost annularly spaced edge ring fin 240*a* of the edge ring 220. In some embodiments, the inwardly directed cantilever 328 extends over the top surface 246 of the innermost annularly spaced edge ring fin 240*a* of the edge ring 220 so that the inner surface 316 of the inwardly directed annular extension 310 is aligned with the inner diameter face 242 of the innermost annularly spaced edge ring fin 240*a*. As used in this manner, the term "aligned with" means that a line extending along the inner diameter face 242 of the innermost annularly spaced edge ring fin 240*a* passes within ±0.5 mm, or ±0.2 mm, or ±0.1 mm.

In some embodiments, the liner 300 further comprises an inner ring 340 extending from the top surface 312 of the inwardly directed annular extension 310 to a bottom surface 342 defining a height $H_{LIR}$ of the inner ring 340. The inner ring 340 has an inner diameter with an inner diameter face 344 and an outer diameter with an outer diameter face 346 defining a width $W_{LIR}$ of the inner ring 340.

In some embodiments, the inner diameter face 344 of the inner ring 340 has a top portion 348 and a bottom portion 349. In the illustrated embodiment, the top portion 349 extends inwardly to form a protrusion 351 over an outer portion of the lower annular ring portion 230, so that the bottom portion 349 extends over the outer ledge 239 of the lower annular ring portion 230. The bottom portion 349 of the inner diameter face 344 of the inner ring 340 is spaced a distance from the outer diameter face 244 of the outermost annularly spaced edge ring fins 240 to restrict a flow of gas passing therebetween.

In some embodiments, the liner 300 further comprises a lower annular ring 350 extending outwardly from the bottom portion 348 of the inner ring 340 to a bottom portion 362 of an outer ring 360. In some embodiments, the liner 300 includes at least one opening 370 in one or more of the outer ring 360 or the inner ring 340 to allow a wafer to pass through during loading/unloading of the processing chamber 100.

Figure 9:
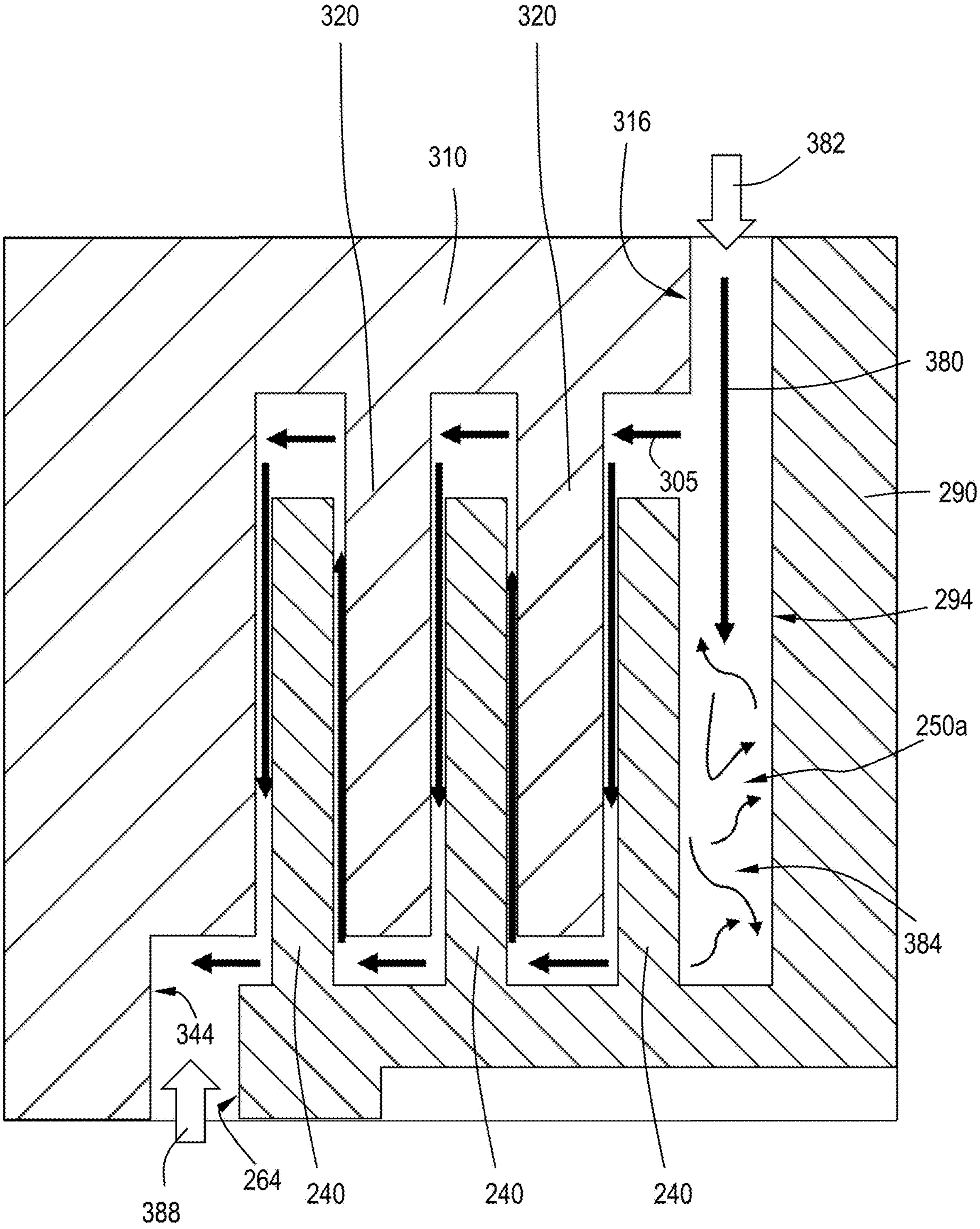
FIG. 9 shows an expanded view of the edge ring and liner in the process position according to one or more embodiments.

FIG. 9 shows an expanded view of the edge ring 220 and liner 300 according to one or more embodiments. When positioned in the process position (as shown) where the plurality of annularly spaced edge ring fins 240 and plurality of annularly spaced liner fins 320 are meshed together to form a tortuous path 380, indicated by the arrows. The non-process position (also referred to as the loading/unloading position) separates the edge ring 220 and liner 300 so that each separately resembles FIGS. 6 and 7.

A flow of gas 382 enters the tortuous path 380 from the process gap 168 through a gap between the inner surface 316 and the outer diameter face 294 of the inner connecting ring 290 of the edge ring 220. In the illustrated embodiment, a dead leg 384 is formed between the inner diameter face 242 of the innermost annularly spaced edge ring fin 240*a* and the outer diameter face 294 of the inner connecting ring 290 of the edge ring 220, causing a turbulent restrictive flow region. The spaces between the plurality of annularly spaced edge ring fins 240 and plurality of annularly spaced liner fins 320 restrict the flow of gas 382 from the process gap 168 to the interior 105 of the semiconductor manufacturing processing chambers 100 below the 170.

In some embodiments, a purge gas 388 flows from the interior 105 of the semiconductor manufacturing processing chambers 100 below the substrate support 170 into the space between the inner diameter face 344 of the inner ring 340 of the liner 300 and the outer diameter face 264 of the bottom ring portion 260 (or the outer diameter 238 of the lower annular ring portion 230) of the edge ring 220. The purge gas 388 flow creates a back pressure on the restricted flow path (tortuous path 380) helping to prevent process gases from the process gap 168 from entering the interior 105 of the semiconductor manufacturing processing chambers 100 below the substrate support 170.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A process kit for a semiconductor manufacturing processing chamber, the process kit comprising:

an edge ring comprising a lower annular ring portion with a plurality of annularly spaced edge ring fins extending upwardly from a top surface of the lower annular ring portion; and a liner having an inwardly directed annular extension with a plurality of annularly spaced liner fins extending downwardly from a bottom surface of the inwardly directed annular extension, the plurality of annularly spaced liner fins positioned to interdigitate with the plurality of annularly spaced edge ring fins without contacting the plurality of annularly spaced edge ring fins so that the plurality of annularly spaced edge ring fins and the plurality of annularly spaced liner fins alternate to create a tortuous flow path, wherein an innermost annularly spaced liner fin is offset from an inner diameter face of the inwardly directed annular extension forming an inwardly directed cantilever.

2. The process kit of claim 1, wherein each of the annularly spaced edge ring fins independently extends a height above the top surface of the lower annular ring portion.

3. The process kit of claim 1, wherein each of the annularly spaced edge ring fins independently has an inner diameter with an inner diameter face and an outer diameter with an outer diameter face defining a width of the annularly spaced edge ring fins-fins.

4. The process kit of claim 3, wherein there are three or more annularly spaced edge ring fins.

5. The process kit of claim 4, wherein gaps between adjacent annularly spaced edge ring fins are substantially the same.

6. The process kit of claim 3, wherein each of the annularly spaced edge ring fins independently has a top surface spaced a distance from the top surface of the lower annular ring portion to define a height of the annularly spaced edge ring fin.

7. The process kit of claim 6, wherein the heights of the annularly spaced edge ring fins are substantially the same.

8. The process kit of claim 1, wherein the edge ring further comprises a bottom ring portion connected to an outer edge of the top surface of the lower annular ring portion, the bottom ring portion having an inner diameter with an inner diameter face and an outer diameter with an outer diameter face defining a width of the bottom ring portion, the outer diameter face extending from the outer edge of the top surface of the lower annular ring portion to a bottom face of the bottom ring portion defining a length of the outer diameter face.

9. The process kit of claim 1, wherein the edge ring further comprises a top annular ring portion having an inner diameter and an outer diameter defining a width of the top annular ring portion, a top surface and a bottom surface defining a thickness of the top annular ring portion, and an inwardly projecting extension with an extension top surface below the top surface of the top annular ring portion and an extension bottom surface above the bottom surface of the top annular ring portion.

10. The process kit of claim 9, wherein the top annular ring portion further comprises an extension foot extending a distance from the bottom surface of the top annular ring portion.

11. The process kit of claim 9, wherein the edge ring further comprises an inner connecting ring in contact with the top annular ring portion and thea bottom annular ring portion, the inner connecting ring having an inner diameter with an inner diameter face and an outer diameter with an outer diameter face defining a width of the inner connecting ring.

12. The process kit of claim 11, wherein an innermost annularly spaced edge ring fin is spaced a distance from the outer diameter face of the inner connecting ring and gaps between adjacent annular spaced edge ring fins are substantially the same.

13. The process kit of claim 12, wherein the outer diameter face of an outermost annularly spaced edge ring fin is offset from an outer diameter face of a bottom ring portion connected to an outer diameter of the lower annular ring portion.

14. The process kit of claim 12, wherein the inwardly directed cantilever extends over a top surface of the innermost annularly spaced edge ring fin.

15. The process kit of claim 14, wherein an inner surface of the inwardly directed annular extension is aligned with the inner diameter face of the innermost annularly spaced edge ring fin.

16. The process kit of claim 14, wherein the liner further comprises an inner ring extending from a top surface of the inwardly directed annular extension to a bottom surface defining a height of the inner ring.

17. The process kit of claim 16, wherein an inner surface of the inner ring has a top portion and a bottom portion, the top portion extending inwardly over an outer portion of the lower annular ring portion of the edge ring.

18. The process kit of claim 16, wherein the liner further comprises a lower annular ring extending outwardly from a bottom portion of the inner ring to a bottom portion of an outer ring.

19. A semiconductor manufacturing processing chamber comprising a process kit comprising:

an edge ring comprising a lower annular ring portion with a plurality of annularly spaced edge ring fins extending upwardly from a top surface of the lower annular ring portion; and a liner having an inwardly directed annular extension with a plurality of annularly spaced liner fins extending downwardly from a bottom surface of the inwardly directed annular extension, the plurality of annularly spaced liner fins positioned to interdigitate with the plurality of annularly spaced edge ring fins without contacting the plurality of annularly spaced edge ring fins so that the plurality of annularly spaced edge ring fins alternate with the plurality of annularly spaced liner fins to create a tortuous flow path, wherein the edge ring further comprises a top annular ring portion having an inner diameter and an outer diameter defining a width of the top annular ring portion, a top surface and a bottom surface defining a thickness of the top annular ring portion, and an inwardly projecting extension with an extension top surface below the top surface of the top annular ring portion and an extension bottom surface above the bottom surface of the top annular ring portion.

20. A process kit for a semiconductor manufacturing processing chamber, the process kit comprising:

an edge ring comprising a top annular ring portion connected to an inner connecting ring extending from a bottom surface of the top annular ring portion, and a lower annular ring portion extending outwardly from an outer surface of the inner connecting ring, the lower annular ring portion having at least three annularly spaced edge ring fins extending upwardly from a top surface of the lower annular ring portion, an innermost annularly spaced edge ring fin spaced a distance from the outer surface of the inner connecting ring; and a liner having an inwardly directed annular extension with at least two annularly spaced liner fins extending downwardly from a bottom surface of the inwardly directed annular extension, the at least two annularly spaced liner fins positioned to interdigitate with the at least three annularly spaced edge ring fins without contacting the at least three annularly spaced edge ring fins so that the at least three annularly spaced edge ring fins alternate with the at least two annularly spaced liner fins to create a tortuous flow path, an innermost annularly spaced liner fin spaced a distance from an inner edge of the inwardly directed annular extension and forming an inwardly directed cantilever, the inwardly directed cantilever extending over a top surface of the innermost annularly spaced edge ring fin.

* * * * *